(12) United States Patent
Aronson et al.

(10) Patent No.: US 10,430,155 B2
(45) Date of Patent: Oct. 1, 2019

(54) METHOD OF CALIBRATING AUDIO OUTPUT DEVICE WITH PLAYBACK OF ADJUSTED AUDIO

(71) Applicant: MeQ, Inc., Richmond, CA (US)

(72) Inventors: Danny Aronson, Tel Aviv (IL); Ofer Nissim Raz, Richmond, CA (US)

(73) Assignee: MeQ, Inc., Richmond, CA (US)

( * ) Notice: Subject to any disclaimer, the term of this patent is extended or adjusted under 35 U.S.C. 154(b) by 0 days.

(21) Appl. No.: 16/020,646

(22) Filed: Jun. 27, 2018

(65) Prior Publication Data

US 2019/0004767 A1   Jan. 3, 2019

Related U.S. Application Data

(60) Provisional application No. 62/526,180, filed on Jun. 28, 2017.

(51) Int. Cl.
| | |
|---|---|
| *G06F 3/16* | (2006.01) |
| *G06F 3/0484* | (2013.01) |
| *H04R 5/04* | (2006.01) |
| *H03G 5/16* | (2006.01) |
| *H03G 3/02* | (2006.01) |
| *H03G 3/30* | (2006.01) |
| *H03G 5/02* | (2006.01) |
| *H04R 29/00* | (2006.01) |
| *H04R 25/00* | (2006.01) |

(52) U.S. Cl.
CPC .......... *G06F 3/165* (2013.01); *G06F 3/04847* (2013.01); *H03G 3/02* (2013.01); *H03G 3/3005* (2013.01); *H03G 5/025* (2013.01); *H03G 5/165* (2013.01); *H04R 5/04* (2013.01); *H04R 25/50* (2013.01); *H04R 29/008* (2013.01); *H04R 2430/01* (2013.01)

(58) Field of Classification Search
CPC .... H04B 1/03; H04B 17/29; H04R 2227/003; H04R 2227/005; H04R 29/00
USPC ............................... 381/56–58, 60; 600/559
See application file for complete search history.

(56) References Cited

U.S. PATENT DOCUMENTS

| | | |
|---|---|---|
| 7,974,716 B2 | 7/2011 | Schumaier |
| 8,077,890 B2 | 12/2011 | Schumaier |
| 8,265,314 B2 | 9/2012 | Schumaier |
| 8,284,968 B2 | 10/2012 | Schumaier |

(Continued)

*Primary Examiner* — Lun-See Lao
(74) *Attorney, Agent, or Firm* — Hickman Palermo Becker Bingham LLP; Christine E. Orich

(57) ABSTRACT

The disclosed technologies calibrate audio output based on a computer-based hearing evaluation. In an embodiment, the disclosed technologies perform operations that include playing an electronic file that contains segments of digital music that have different playback attributes, wherein playback attribute include at least one of volume data, frequency data, left/right data; during the playing of the electronic file, recording timestamp data and user account data that are associated with a user input; mapping the timestamp data to a set of playback attributes of a segment of the digital music; determining calibration data based on the timestamp data and the set of playback attributes; storing the calibration data in a user profile that is associated with the user account data; when different digital music is played, automatically calibrating the playing of the different digital music based on the user profile that is associated with the user account data.

20 Claims, 5 Drawing Sheets

(56) References Cited

U.S. PATENT DOCUMENTS

| | | |
|---|---|---|
| 8,396,237 B2 | 3/2013 | Schumaier |
| 8,472,634 B2 | 6/2013 | Schumaier et al. |
| 8,811,642 B2 | 8/2014 | Schumaier |
| 8,885,842 B2 * | 11/2014 | Chen .................... H04R 3/005 381/56 |
| 9,031,272 B2 | 5/2015 | Schumaier |
| 9,782,131 B2 * | 10/2017 | Van Hasselt ........... A61B 5/123 |
| 2004/0190729 A1 * | 9/2004 | Yonovitz ................. G01H 3/14 381/72 |
| 2010/0039296 A1 * | 2/2010 | Marggraff ........... G06F 3/03545 341/20 |
| 2014/0194775 A1 * | 7/2014 | Van Hasselt ........... A61B 5/123 600/559 |
| 2017/0289646 A1 * | 10/2017 | Kanthapanit ...... H04N 21/8547 |

\* cited by examiner

METHOD OF CALIBRATING AUDIO OUTPUT DEVICE WITH PLAYBACK OF ADJUSTED AUDIO

BENEFIT CLAIM

This application claims priority to and the benefit of provisional application 62/526,180, filed Jun. 28, 2017, the entire contents of which is hereby incorporated by reference for all purposes as if fully set forth herein.

TECHNICAL FIELD

The present disclosure generally relates to technologies for adjusting audio files for playback by an audio device.

BACKGROUND

The developments described in this section are known to the inventors. However, unless otherwise indicated, it should not be assumed that any of the developments described in this section qualify as prior art merely by virtue of their inclusion in this section, or that these developments are generally known to a person of ordinary skill in the art.

The effectiveness of an audio output device in creating a quality hearing experience can vary substantially from person to person, notwithstanding the technical specifications of the device.

SUMMARY

In an embodiment, a method for calibrating playback of digital music based on a self-administered computer-assisted hearing evaluation includes playing an electronic file that contains at least two segments of digital music that have different sets of playback attributes, where a set of playback attributes includes at least one of volume data, frequency data, left/right data. During the playing of the electronic file, timestamp data and user account data that are associated with a particular user input are recorded. The timestamp data is mapped to a particular set of playback attributes of a particular segment of the digital music.

Calibration data is determined based on the timestamp data and the particular set of playback attributes. The calibration data is stored in a user profile that is associated with the user account data. When different digital music is played, automatically calibrating the playing of the different digital music based on the user profile that is associated with the user account data. The method is performed by one or more computing devices.

In an embodiment, a graphical representation of playback attributes that are used to conduct the computer-assisted hearing evaluation is displayed in a user interface that is coupled to one or more computing devices. During the playing, the user interface is updated to include a graphical representation of the timestamp data in relation to the playback attributes.

In an embodiment, the user interface is displayed in a web-based software application that is coupled to the one or more computing devices. In an embodiment, the user interface is displayed in a mobile device application that is coupled to the one or more computing devices.

In an embodiment, updating the user interface includes displaying a set of concentric circles each representing a different volume level, displaying a set of radii emanating inwardly from a perimeter circle of the set of concentric circle, where a length of a particular radius is determined based on the timestamp data. In an embodiment, updating the user interface includes graphically dividing the set of concentric circles to represent the left/right data.

In an embodiment, timestamp data is recorded, where the timestamp data is associated with particular user inputs received in response to the playing of the at least two segments of the digital music, and the user interface is updated to include nodes that correspond to the at least two segments and radii emanating from the nodes, where the radii represent the timestamp data associated with the particular user input received in response to playing the corresponding segment of the digital music.

Figure 1:
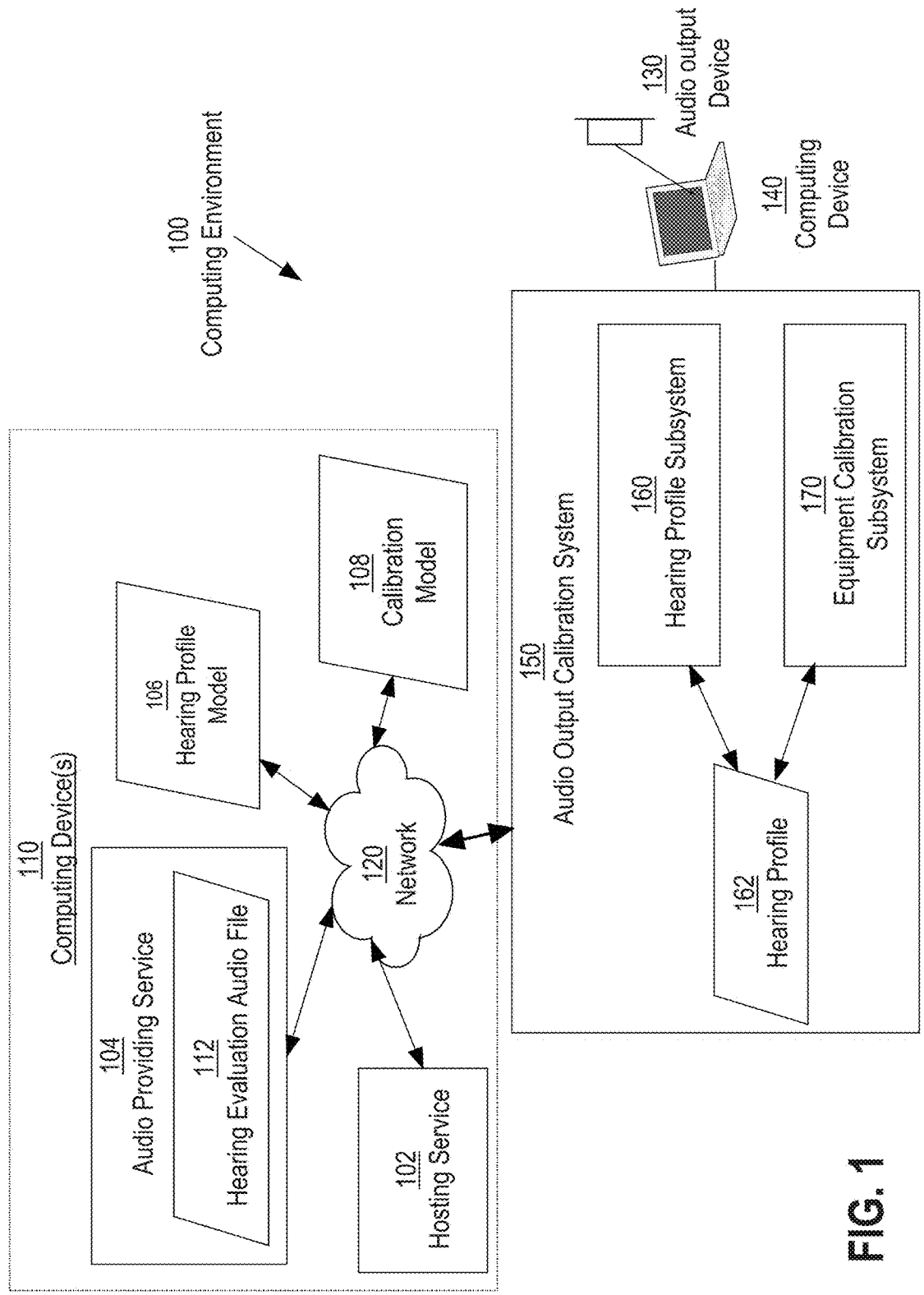
FIG. 1 is a simplified block diagram illustrating at least one embodiment of a computing environment in which aspects of the present disclosure may be implemented.

While the present invention is amenable to various modifications and alternative forms, specific embodiments are shown by way of example in the drawings and are described in detail. It should be understood, however, that the drawings and detailed description are not intended to limit the invention to the particular form disclosed. The intention is to cover all modifications, equivalents, and alternatives falling within the spirit and scope of the present invention as defined by the appended claims.

DETAILED DESCRIPTION

Overview

In the following description, for the purposes of explanation, numerous specific details are set forth to provide a more thorough understanding of the present invention. It will be apparent, however, that the present invention may be practiced without these specific details. In the drawings, the depiction of structures and devices may be simplified to avoid unnecessarily obscuring the present invention.

As described in this disclosure, a computing device executing a graphical user interface of a web-based software application or a mobile device software application can obtain hearing profile data by conducting an automated and self-administered hearing evaluation through the graphical user interface of the web-based application or mobile device application, and use the hearing profile data to adjust playback of a digital audio file by a digital audio output device.

Environment Overview

FIG. 1 illustrates a computing environment 100 in which embodiments of the features described in this document can be implemented. The environment 100 includes at least computing devices 110 and computing device 140, which are communicatively coupled to an electronic communications network 120. The illustrative computing device 140 is a client computing device, such as a mobile computing device, wearable computing device, smart appliance, or laptop machine, while computing device 110 is a server computer or network of server computers connected to the Internet, in the cloud. Computing device 140 is equipped with or coupled to an audio output device 130. Audio output device 130 comprises a hearing or listening device, for example a device that includes one or more electroacoustic transducers. Audio output device 130 may be implemented as, for example, a set of headphones, earphones, earbuds, speakers, BLUETOOTH speakers or other type of hearing or listening equipment, and may be communicatively coupled to computing device 140 by any suitable form of electronic communication connection, including a wired, wireless, or optical connection. In some embodiments, audio output device 130 and/or portions of computing device 140 may be implemented in a mobile or wearable electronic device, such as a smart phone, smart glasses or wireless earpiece, and may include other sensors, such as a microphone, camera, etc. For instance, audio output device 130 and all or portions of computing device 140 may be implemented as a single electronic device.

Implemented in computing devices 110, 140 using computer software, hardware, or software and hardware, are combinations of automated functionality, data structures, and digital data, which are represented schematically in FIG. 1 as hosting service 102, audio providing service 104, hearing profile model 106, calibration model 108, audio output calibration system 150, hearing profile subsystem 160, and equipment calibration subsystem 170.

Although computing environment 100 may be implemented with any number of hosting services 102, audio providing services 104, hearing profile models 106, calibration models 108, audio output calibration systems 150, computing devices 110, audio output devices 130 and computing devices 140, respectively, in this disclosure, these elements may be referred to in the singular form for ease of discussion. Also, hosting service 102, audio providing service 104, hearing profile model 106, calibration model 108 and audio output calibration system 150 are shown as separate elements in FIG. 1 for ease of discussion but the illustration is not meant to imply that separation of these elements is required.

The illustrated systems (or their functionality) may be divided over any number of physical systems, including a single physical computer system, and can communicate with each other in any appropriate manner. For example, in some implementations, audio providing service 104, hearing profile model 106, calibration model 108 and audio output calibration system 150 are all executed by or from a single web-based software application, which is made accessible to an end user of computing device 140 over network 120, by a web page. In another embodiment, audio providing service 104 and all elements of audio output calibration system 150 comprise sequences of instructions and data stored in one or more non-transitory computer-readable storage media and when executed using computing device(s) 110 or computing device 140 cause one of the computing devices to perform the functions that are further described herein for the system 150. For example, audio providing service 104 and each of the hearing profile subsystem 160 and equipment calibration subsystem 170 may comprise subroutines, methods, programmatic objects or other software elements, separate or integrated, that the computing devices may execute to provide the specified functions. Each of the hearing profile model 106, calibration model 108 and hearing profile 162 may comprise a digitally stored dataset which the subsystems read or write as needed to provide the functions. Alternatively, one or more of the audio providing service 104, hearing profile subsystem 160 and equipment calibration subsystem 170 may be implemented as FPGAs, ASICs, or in a combination of processors, firmware and software.

Hosting service 102 enables network access to one or more of audio providing service 104, hearing profile model 106, and calibration model 108. For example, hosting service 102 may be implemented as a web service that hosts third party software applications.

Audio providing service 104 comprises or provides access to a searchable online repository of digital audio files. Audio providing service 104 may be implemented as, for example, a consumer-oriented repository of sound files, an online music service, a repository of audio-visual files or a video service. As used in this document, audio file may refer to any item of digital content that has an audio component, including video files that have an audio track. Audio providing service 104 may additionally provide a digital audio player, such as a web plug-in or a standalone media player.

Illustratively, audio providing service 104 stores and makes accessible to the audio output calibration system 150 a hearing evaluation audio file 112. As described in more detail below, hearing evaluation audio file 112 is configured so that when the file 112 is played by a digital audio player, an interactive hearing evaluation script is executed using computing device 140 and audio output device 130. Playing of the hearing evaluation file 112 by a digital audio player enables a person ("user") listening to the hearing evaluation file 112 to self-administer a hearing evaluation by interacting with computing device 140 and/or audio output device 130.

Hearing profile model 106 comprises specifications that can be used by hearing profile subsystem 160 to create a hearing profile 162. Hearing profile 162 can be used by audio output calibration subsystem 170 to adjust playback of audio through audio output device 130. For example, hearing profile model 106 may include a set of requirements for computing environment 100 to implement in performing an automated hearing evaluation, such as the number of hearing tests to perform in total, the number of hearing tests to perform on each ear, the frequencies of audio samples to use to perform the hearing tests, the duration of the hearing test, the duration of specific segments of the hearing test, the volume(s) at which to play audio samples used to conduct the hearing tests, and/or the progression of volume changes for an audio sample. Hearing profile model 106 may be implemented as, for example, a computerized data structure or a template used to store parameter values, or a set of rules implemented using computer program logic, which can be accessed and read or executed by hearing profile subsystem 160 to conduct an automated and self-administered hearing evaluation and create a hearing profile 162 for a person using computing device 140.

Hearing profile 162 comprises data generated by hearing profile subsystem 160 during executing of an automated and self-administered hearing evaluation. For example, hearing profile 162 comprises user-specific parameter values obtained by hearing profile subsystem 160 during conducting of an automated hearing evaluation using hearing profile model 106. In an embodiment, a hearing profile contains a personalized mapping of volume levels to audio frequencies, where the personalized mapping is created based on timestamp data that is obtained by the system during a hearing evaluation. The timestamp data indicates the moment at which the user began to hear a particular portion of music at a particular frequency, when the music is played at an increasingly louder volume, with the volume increases occurring at time intervals that are defined in accordance with the requirements of a particular design of the system. Thus hearing profile 162 indicates, for a particular user (as represented to the computing system by a user account identifier, for example), the volumes at which the user can clearly hear particular sound frequencies, in both left and right ears, since the user's hearing may be different in each ear. Hearing profile 162 may be implemented, for instance, as digital data stored in a database record, a document, or other suitable data structure, in computer memory of computing device 140 or computing device 110.

Calibration model 108 comprises specifications that are used by equipment calibration subsystem 170 to calibrate audio output device 130 to adjust playback of digital audio files in accordance with hearing profile 162. For example, calibration model 108 may include a set of requirements for computing environment 100 to implement in adjusting audio file playback based on hearing profile 162. Calibration model 108 may specify precise adjustments to be made either in hardware or software (such as adjustments in the audio output device 130 or adjustments to be made in or by the digital audio player software used to play back an audio file), depending on the specific parameter values stored in the hearing profile 162. In addition, some embodiments of calibration model 108 include data received from the user or obtained from another data source. For example, specifications of audio output device 130, such as the audio response curve for the particular audio output device 130, may be obtained from the user or from a web page posted by a manufacturer of the device 130.

Calibration model 108 may be implemented as a mapping table or other suitable computer programming structure that correlates or defines relationships between hearing evaluation results and corresponding calibration adjustments that are needed to personalize audio playback parameters for a particular user's hearing level. Calibration model 108 may specify adjustments based on, for example, an entire hearing profile or individual portions of the profile, such as specific adjustments to be made for each ear and/or audio frequency and/or audio amplitude value. The specific adjustments that need to be made are dependent on the particular audio output device that is used and are determined based on the manufacturer's specifications for the output device.

Audio output calibration system 150 operates to, by hearing profile subsystem 160, execute an online hearing evaluation script that enables the user to conduct a personalized hearing evaluation, create a hearing profile 162 that reflects the results of the computer-conducted hearing evaluation, and, by equipment calibration subsystem 170, execute a routine to automatically calibrate playback of digital audio through audio output device 130 based on the hearing profile 162.

Calibration Method

Figure 2:
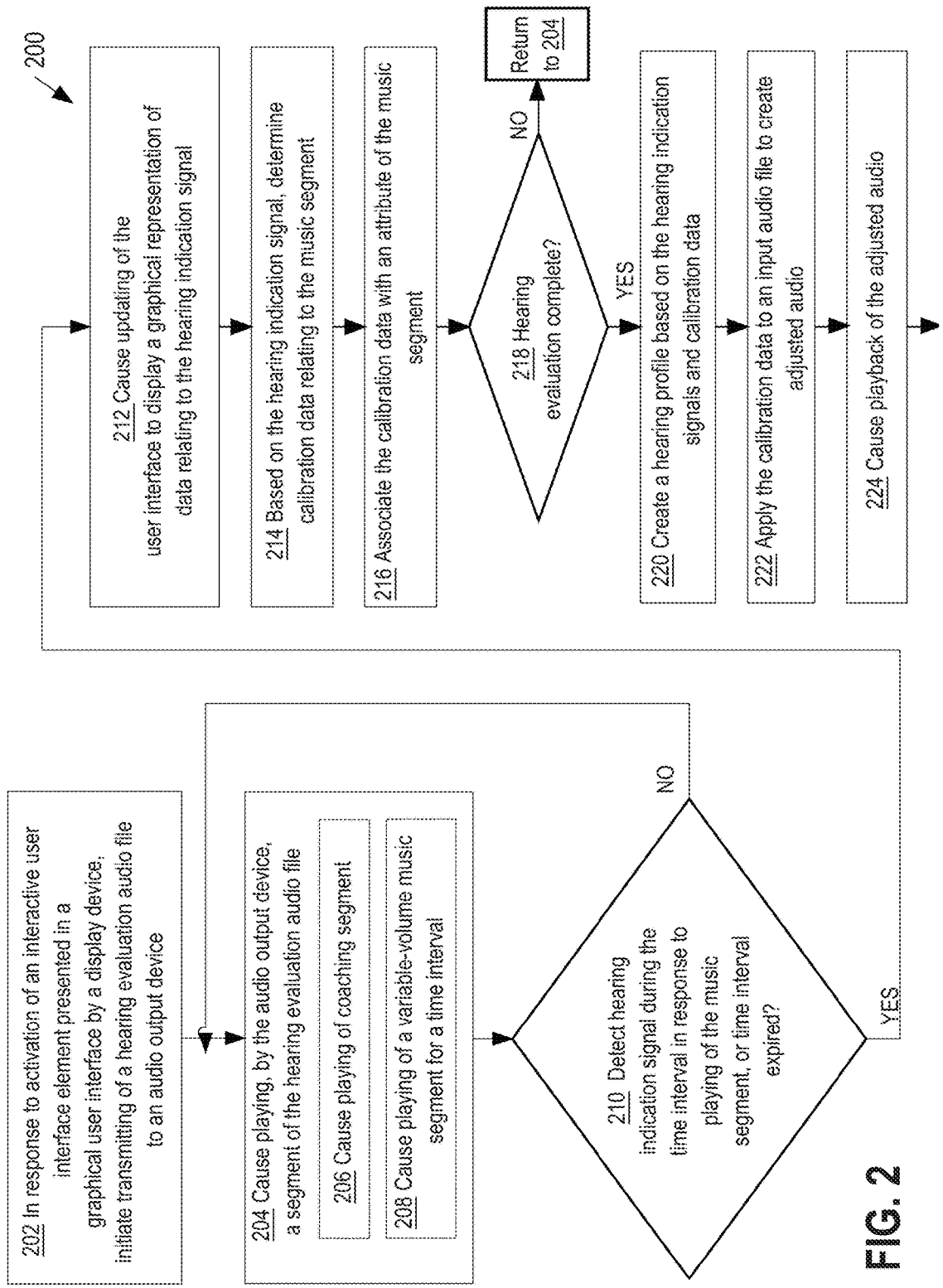
FIG. 2 is a simplified flow diagram of a process that may be executed by one or more components of the computing environment of FIG. 1.

FIG. 2 is a simplified flow diagram 200 of a specific embodiment of operations that can be performed by one or more components of computing environment 100, for example, by computing device 110 communicating with computing device 140 over network 120. The operations shown in FIG. 2 can be implemented using processor-executable instructions that are stored in computer memory. Illustratively, the operations of FIG. 2 are described as being performed by computing device 110.

In operation 202, computing device 110 receives a signal over network 120 indicating that user input has been received, for example that an interactive user interface element presented in a graphical user interface displayed in a web page on a display device has been activated, for example by a person interacting with an input device, where the input device is configured to sense tapping on a touch-screen, clicking a mouse, movement of a cursor, etc., and the input device and the display device are coupled to or part of computing device 140.

In response to activation of the user interface element, computing device 110 initiates transmitting of a hearing evaluation audio file such as file 112 to an audio output device, for example audio output device 130, which is used by the person who has interacted with the input device that is part of or coupled to computing device 140. In some embodiments, computing device 110 and/or audio output device 130 are configured to initiate and conduct all or portions of the hearing evaluation by an interactive audio or voice-based dialog with the user alternatively or in addition to interacting with a graphical user interface. To conduct the audio or voice-based dialog, automated speech recognition and speech to text technologies are implemented in or accessed by computing device 110 and/or audio output device 130.

The hearing evaluation audio file is configured in accordance with the hearing profile model 106; that is, the hearing evaluation audio file is designed to elicit user responses to playback of digital audio samples. For instance, the hearing evaluation audio file may comprise several audio elements, including a coaching segment and multiple variable-volume music segments. In one implementation, the coaching segment includes multiple synthesized or pre-recorded speech portions in which a human or human-sounding voice explains the hearing evaluation process and provides verbal guidance to the user on whom the automated hearing evaluation is being performed.

The hearing evaluation audio file includes segments of digital music. The segments of digital music each have an associated set of playback attributes that include, for example, volume data and/or frequency data and/or left/right ear data. In an embodiment, each digital music segment contains audio that corresponds to a particular audio frequency played at an increasingly louder or increasingly software volume over the duration of the segment. For example, the segment of a particular frequency starts at a low volume and increases over a time interval, or vice versa. In some embodiments, the music segments contain snippets of actual music as opposed to specific tones or sounds. For example, a segment might contain the bass track or the percussion track or the vocal track of a particular song, or a segment might contain a combination of different tracks such as all wind instruments or all brass instruments or all male vocalists, etc.

Variable-volume as used in this document may refer to the pre-programmed variation of the volume at which music in the pre-recorded or synthesized music segment is played. For example, each music segment may contain a sample of music of a given time duration, and the music segment may be comprised of smaller sub-segments, each of which is played at a different volume. Each successive music sub-segment may be played at a higher volume than the preceding sub-segment, so that a user listening to the music segment perceives the volume of the audio increasing as the audio file is played. The rate at which the volume is increased in each music segment and the duration of each volume-specific sub-segment can be pre-defined, configured during setup of the application for a particular user, or controlled programmatically.

In operation 204, the automated hearing evaluation is conducted by computing device 110 causing playing, through computing device 140 and/or audio output device 130, a series or sequence of coaching segments (operation 206) and/or fixed-interval variable-volume pre-recorded or synthesized music segments (operation 208). In operation 210, computing device 110 waits or listens for a hearing indication signal to be detected or received during a time interval in which a music segment is played. The hearing indication signal may be generated by or as a result of user activity at computing device 140, such as activation of a user interface element by clicking a mouse, tapping a touchscreen, or saying into a microphone of computing device 140 "I hear it"—any method of indicating that the played music segment has been heard by the user may be used.

The hearing indication signal may include a timestamp that may be used to correlate the hearing indication signal with the music segment played in operation 208. In some embodiments, the timestamp data is captured each time the system detects a hearing indication signal, and the timestamp data is then associated with the playback attributes of the particular segment that was being played when the hearing indication signal was received.

If a hearing indication signal is received, or the music segment finishes playing without a hearing indication signal being received, computing device 110 proceeds to operation 210. The computing device 110 returns to operation 204 continuously while the music segment is being played, until expiration of the time interval associated with the music segment or until a hearing indication signal is received. Coaching segments may be interjected by computing device 110 (such as by voice over) during playing of the music segment to encourage the user to continue interacting with the computer to perform the hearing evaluation, or for other reasons.

Figure 4:
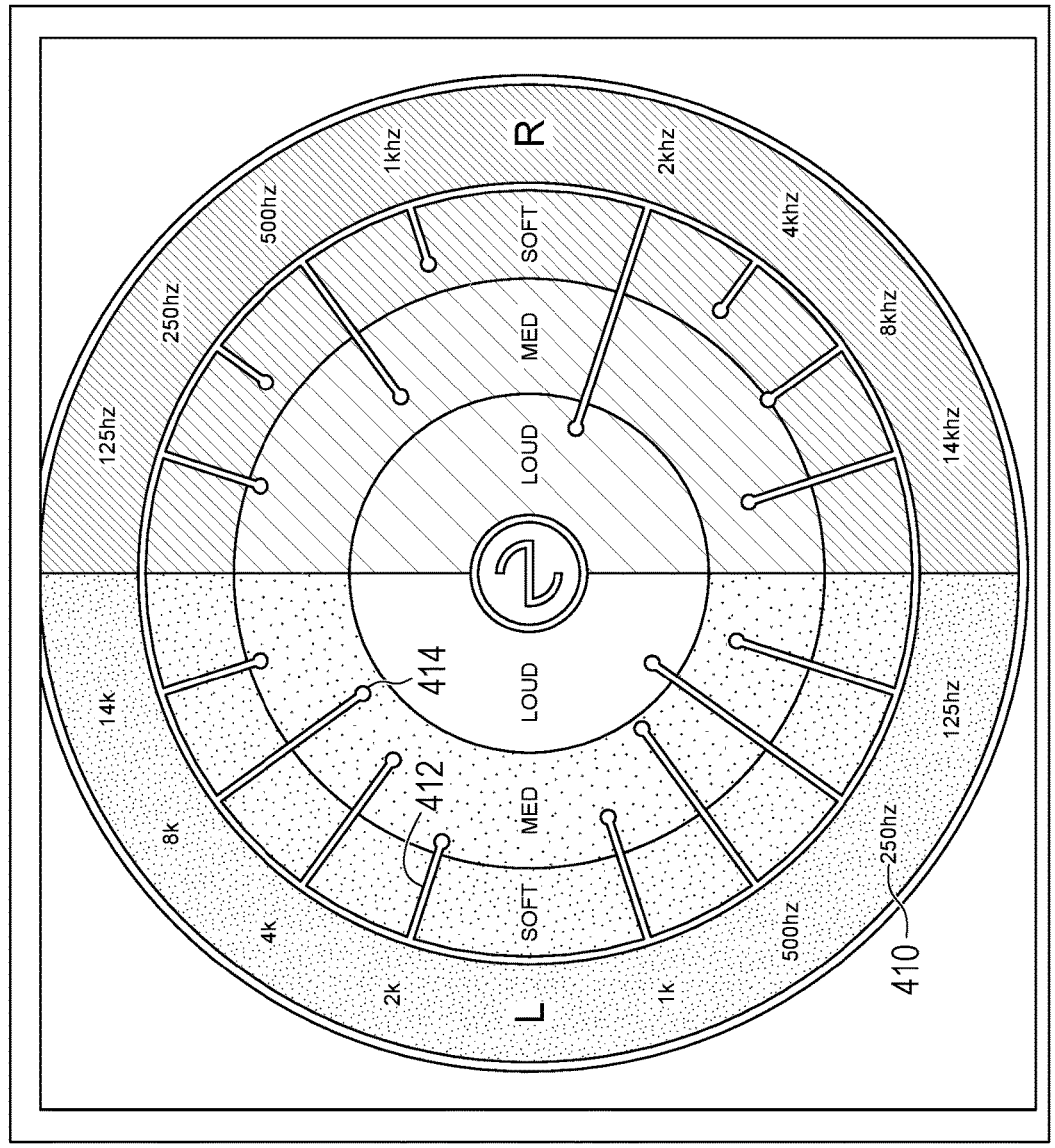
FIG. 4 is a simplified example of another graphical user interface that may be implemented by the process of FIG. 2.

In operation 212, computing device 110 causes the graphical user interface displayed in display device of computing device 140 to display a graphical representation of data relating to the hearing indication signal that was received in operation 210 (or, if no hearing indication signal has been received, a 'default' signal is used to generate a corresponding graphic). Examples of graphics representing hearing indication signals are shown in FIG. 4, described below. In some embodiments, the graphical display of data relating to hearing indication signals is omitted or deferred to a later time. For example, computing device 110 may use an interactive voice dialog to inform the user that hearing evaluation related data is being sent to the user's e-mail inbox or being stored in the user's online profile, which the user may review at a later time.

In operation 214, computing device 110 determines calibration data relating to the music segment just played in operation 204, which elicited the hearing indication signal (or a default signal) in operation 210. Computing device 110 determines calibration data by, for example, mapping information relating to the hearing indication signal (such as timestamp data and playback attribute data for the corresponding music segment) to calibration parameters obtained from calibration model 108.

In operation 216, computing device 110 associates the calibration data obtained in operation 214 with an attribute of the music segment that elicited the hearing indication signal. Example attributes of the music segment include frequency (pitch), amplitude (loudness or volume), and response time (how quickly the user supplied the hearing indication signal in response to playing of a music segment).

In operation 218, computing device 110 determines whether the hearing evaluation is completed. To determine whether the hearing evaluation is completed, computing device 110 may access information stored in the hearing profile model 106 or may simply determine whether the hearing evaluation audio file has finished playing or whether a hearing indication signal has been obtained for each of the music segments in the hearing evaluation audio file. If computing device 110 determines that the hearing evaluation is not finished, computing device 110 returns to operation 204 to execute the next portion of the hearing evaluation. If computing device 110 determines that the hearing evaluation is complete, computing device 110 proceeds to operation 220.

In operation 220, computing device 110 creates a hearing profile for the user based on the hearing indication signals obtained during playback of the audio elements of the hearing evaluation audio file and the corresponding calibration data generated in the preceding operations. The hearing profile is stored in computer memory in association with the user account data for the particular user that conducted the hearing evaluation.

In operation 222, computing device 110 applies the calibration data of the hearing profile to an input audio file, to create adjusted audio. That is, in operation 222, computing device 110 uses the results of the automated hearing evaluation performed in the preceding operations, including the calibration data, to adjust the way in which the input audio file is output to the user through audio output device 130. These compensation adjustments may be made by hardware or software of the audio output device 130 or the computing device 140, or may be made by manipulating the input audio file itself, prior to playing the input audio file through the audio output device 130. The input audio file may be any digital audio file selected by the user, for example a music file made available by audio providing service 104.

In any case, computing device 110 plays the adjusted audio through the audio output device 130 in operation 224. In some embodiments, computing device 110 alternately plays the adjusted audio and the original, unadjusted input audio, so that the user can hear the difference between the adjusted audio and the original, unadjusted audio.

Figure 3:
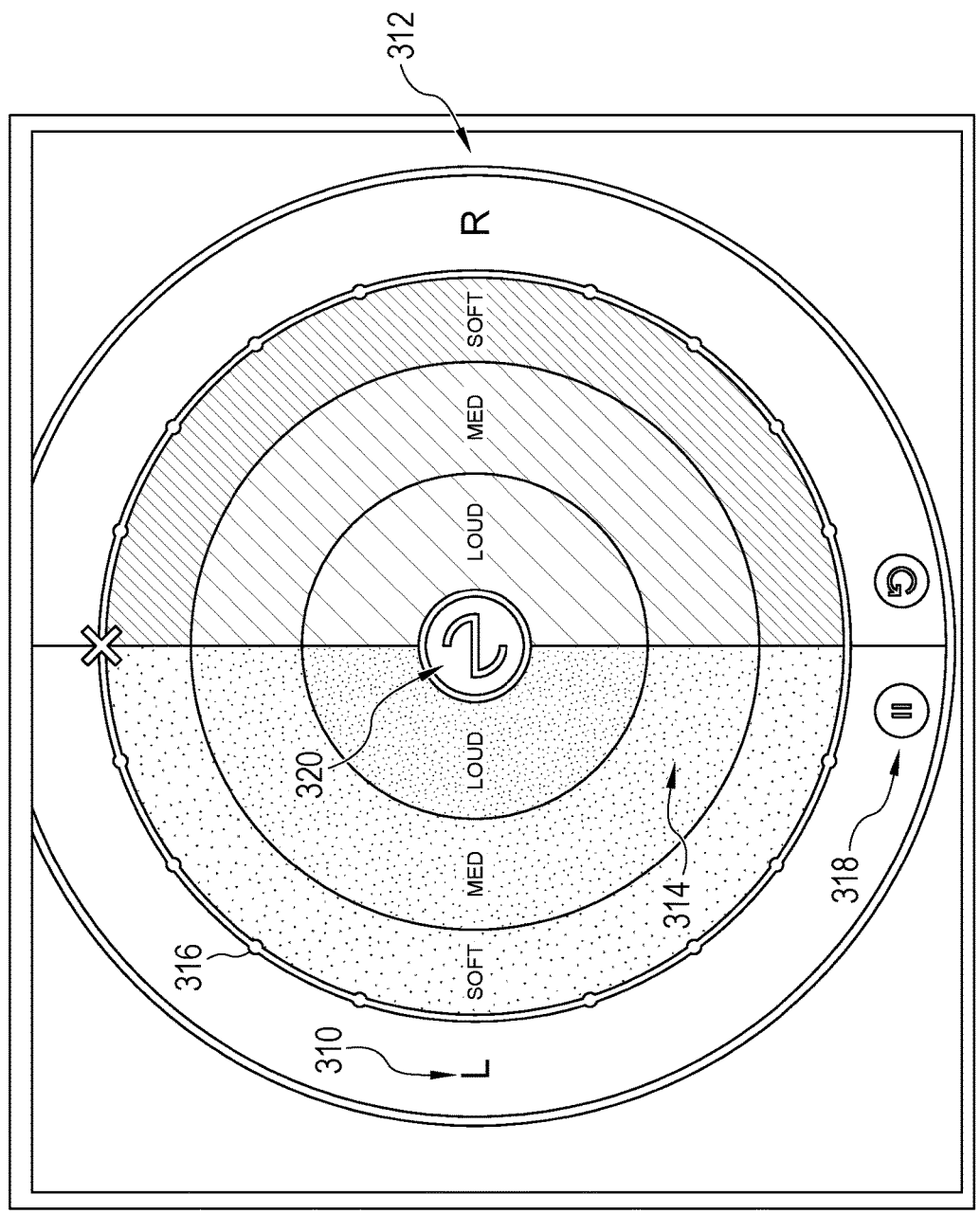
FIG. 3 is a simplified example of a graphical user interface that may be implemented by the process of FIG. 2.

FIG. 3 is a simplified illustration of an embodiment of a graphical user interface (GUI) 300 that may be displayed by computing device 140 as part of a web page or mobile device application, as described in this document. The GUI 300 illustrates a graphic that computing device 110 may cause to be displayed on a web page or a mobile device application in a display device of computing device 140 at the beginning of a hearing evaluation. The graphic includes semicircular portions 310, 312, which correspond to left and right ear portions of the hearing evaluation. A circular band has nodes 316. Each node 316 represents a different portion of the hearing evaluation. For example, each node 316 corresponds to a different music segment (which may correspond to a particular audio frequency) of the hearing evaluation audio file.

Each different music segment may correspond to a different frequency at which hearing is sought to be evaluated. An interior portion 314 displays concentric circles that represent gradations indicating a loudness progression from soft, nearest the nodes 316, to loud, furthest away from the nodes 316 and closest to a center button 320. Center button 320 is interactive. User interaction with button 320 on the graphical user interface causes the automated hearing evaluation to begin. At 318 are a pause button, which allows the user to pause the hearing evaluation, and a reset button, which allows the user to re-start the hearing evaluation from the beginning.

FIG. 4 is a simplified illustration of an embodiment of a graphical user interface (GUI) 400 that may be displayed by computing device 140 as part of a web page, as described in this document. The GUI 400 illustrates a graphic that computing device 110 may cause to be displayed on a web page or a mobile device application in a display device of computing device 140 at the completion of the automated hearing evaluation. The GUI 400 includes elements similar to those shown in FIG. 3 and described above. Additionally, GUI 400 includes indicators 410 and graphical elements 412, 414. Indicators 410 illustrate an attribute of each music segment played during the automated hearing evaluation, such that a music segment and its attribute (here, frequency) are associated with each node 316.

In the illustrated embodiment, computing device 110 causes GUI 400 to draw a graphical element 412 (here, a line, or radius) while the music segment associated with the corresponding node 316/frequency 410 is being played, during execution of the automated hearing evaluation. Computing device 110 causes GUI 400 to stop drawing the line/radius when the hearing indication signal is received. The length of the line 412 correlates with the amount of time that elapsed during playing of the music segment until the hearing indication signal was received or the music segment finished playing, as indicated by the timestamp data As the music segment is pre-configured with a variable volume (the volume of the music increasing at a pre-determined rate over the length of the music segment), the time elapsed before a hearing indication signal is received correlates with the volume at which the music segment was being played when the hearing indication signal was received. Thus, the longer the length of the line 412, the louder the volume of the music segment at the time the hearing indication signal was detected. A line 412 is generated for each of the music segments played during the hearing evaluation. Graphical element 414 illustrates the terminus of a line 412.

As noted above, all or portions of the user interface for presenting data relating to hearing indication signals and/or a hearing profile can be implemented using an audio-based user experience such as an interactive voice dialog, rather than a graphical display.

Implementation Example—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, mobile computing devices, wearable devices, networking devices or any other device that incorporates hard-wired and/or program logic to implement the techniques.

Figure 5:
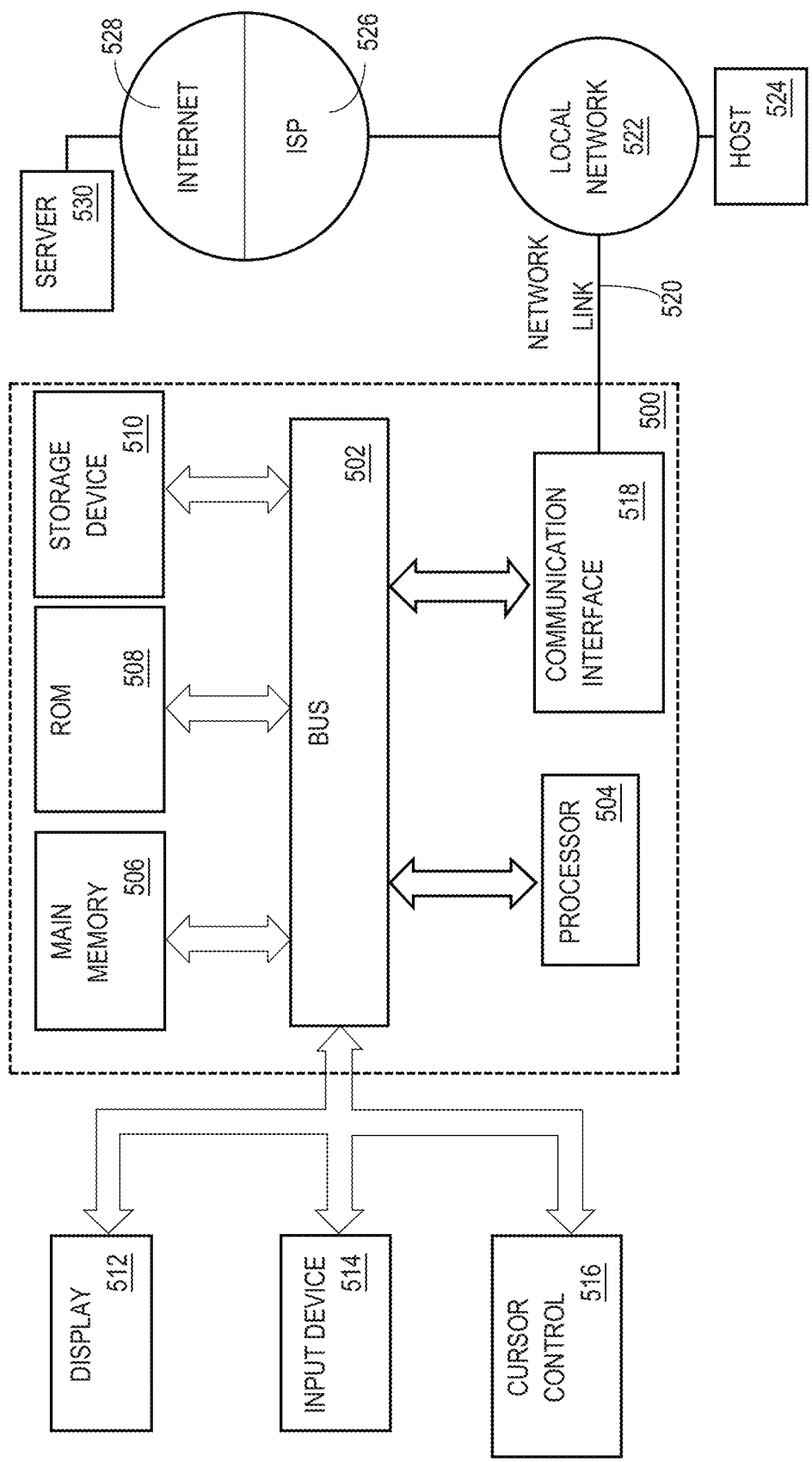
FIG. 5 is a simplified block diagram illustrating an embodiment of a hardware environment, which may be used to implement various aspects of the computing system of FIG. 1.

For example, FIG. 5 is a block diagram that illustrates a computer system 500 upon which an embodiment of the present invention may be implemented. Computer system 500 includes a bus 502 or other communication mechanism for communicating information, and a hardware processor 504 coupled with bus 502 for processing information. Hardware processor 504 may be, for example, a general-purpose microprocessor.

Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Such instructions, when stored in non-transitory computer-readable storage media accessible to processor 504, render computer system 500 into a special-purpose machine that is customized to perform the operations specified in the instructions.

Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 510. Volatile media includes dynamic memory, such as main memory 506. Common forms of storage media include, for example, a hard disk, solid state drive, flash drive, magnetic data storage medium, any optical or physical data storage medium, memory chip, or the like.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid-state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world-wide packet data communication network commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518. The received code may be executed by processor 504 as it is received, and/or stored in storage device 510, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Any definitions set forth herein for terms contained in the claims may govern the meaning of such terms as used in the claims. No limitation, element, property, feature, advantage or attribute that is not expressly recited in a claim should limit the scope of the claim in any way. The specification and drawings are to be regarded in an illustrative rather than a restrictive sense.

As used herein the terms "include" and "comprise" (and variations of those terms, such as "including," "includes," "comprising," "comprises," "comprised" and the like) are intended to be inclusive and are not intended to exclude further features, components, integers or steps.

Various features of the disclosure have been described using process steps. The functionality/processing of a given process step could potentially be performed in various different ways and by various different systems or system modules. Furthermore, a given process step could be divided into multiple steps and/or multiple steps could be combined into a single step. Furthermore, the order of the steps can be changed without departing from the scope of the present disclosure.

It will be understood that the embodiments disclosed and defined in this specification extend to alternative combinations of the individual features mentioned or evident from the text or drawings. These different combinations constitute various alternative aspects of the embodiments.

What is claimed is:

1. A method for calibrating playback of digital music based on a self-administered computer-assisted hearing evaluation, the method comprising:
    creating calibration data by: playing an electronic file that contains at least two segments of digital music that have different sets of playback attributes, wherein a set of playback attributes includes at least one of volume data, frequency data, left/right data; during the playing of the electronic file, recording timestamp data and user account data that are associated with a time at which a particular user input is received and a particular segment of the digital music that is playing at the time the particular user input is received; mapping the timestamp data to a particular set of playback attributes of the particular segment of the digital music; determining the calibration data based on the timestamp data and the particular set of playback attributes;
    storing the calibration data in a user profile that is associated with the user account data;
    when different digital music is played, using the calibration data, automatically calibrating the playing of the different digital music based on the user profile that is associated with the user account data, wherein the method is performed by one or more computing devices.

2. The method of claim 1, comprising:
    displaying, in a user interface that is coupled to the one or more computing devices, a graphical representation of playback attributes that are used to conduct the computer-assisted hearing evaluation;
    during the playing, updating the user interface to include a graphical representation of the timestamp data in relation to the playback attributes.

3. The method of claim 2, comprising displaying the user interface in a web-based software application that is coupled to the one or more computing devices.

4. The method of claim 2, comprising displaying the user interface in a mobile device application that is coupled to the one or more computing devices.

5. The method of claim 2, wherein updating the user interface includes displaying a set of concentric circles each representing a different volume level, displaying a set of radii emanating inwardly from a perimeter circle of the set of concentric circle, wherein a length of a particular radius is determined based on the timestamp data.

6. The method of claim 5, wherein updating the user interface includes graphically dividing the set of concentric circles to represent the left/right data.

7. The method of claim 2, comprising recording timestamp data associated with particular user inputs received in response to the playing of the at least two segments of the digital music, and updating the user interface to include nodes that correspond to the at least two segments and radii emanating from the nodes, wherein the radii represent the timestamp data associated with the particular user input received in response to playing the corresponding segment of the digital music.

8. A computer system comprising:
   at least one computer processor;
   a calibration system that is coupled to the at least one computer processor and programmed to perform:
   creating calibration data by: playing an electronic file that contains at least two segments of digital music that have different sets of playback attributes, wherein a set of playback attributes includes at least one of volume data, frequency data, left/right data; during the playing of the electronic file, recording timestamp data and user account data that are associated with a time at which a particular user input is received and a particular segment of the digital music that is playing at the time the particular user input is received; mapping the timestamp data to a particular set of playback attributes of the particular segment of the digital music; determining the calibration data based on the timestamp data and the particular set of playback attributes;
   storing the calibration data in a user profile that is associated with the user account data;
   when different digital music is played, using the calibration data, automatically calibrating the playing of the different digital music based on the user profile that is associated with the user account data, wherein the method is performed by one or more computing devices.

9. The system of claim 8, wherein the calibration system performs operations comprising:
   displaying, in a user interface that is coupled to the one or more computing devices, a graphical representation of playback attributes that are used to conduct the computer-assisted hearing evaluation;
   during the playing, updating the user interface to include a graphical representation of the timestamp data in relation to the playback attributes.

10. The system of claim 8, wherein the calibration system performs operations comprising displaying the user interface in (i) a web-based software application that is coupled to the one or more computing devices or (ii) a mobile device application that is coupled to the one or more computing devices.

11. The system of claim 8, wherein updating the user interface includes displaying a set of concentric circles each representing a different volume level, displaying a set of radii emanating inwardly from a perimeter circle of the set of concentric circle, wherein a length of a particular radius is determined based on the timestamp data.

12. The system of claim 8, wherein, wherein updating the user interface includes graphically dividing the set of concentric circles to represent the left/right data.

13. The system of claim 8, wherein the calibration system performs operations comprising recording timestamp data associated with particular user inputs received in response to the playing of the at least two segments of the digital music, and updating the user interface to include nodes that correspond to the at least two segments and radii emanating from the nodes, wherein the radii represent the timestamp data associated with the particular user input received in response to playing the corresponding segment of the digital music.

14. One or more non-transitory computer-readable storage media storing sequences of instructions which, when executed by at least one processor, cause the processor to perform:
   creating calibration data by: playing an electronic file that contains at least two segments of digital music that have different sets of playback attributes, wherein a set of playback attributes includes at least one of volume data, frequency data, left/right data; during the playing of the electronic file, recording timestamp data and user account data that are associated with a time at which a particular user input is received and a particular segment of the digital music that is playing at the time the particular user input is received; mapping the timestamp data to a particular set of playback attributes of the particular segment of the digital music; determining the calibration data based on the timestamp data and the particular set of playback attributes;
   storing the calibration data in a user profile that is associated with the user account data;
   when different digital music is played, using the calibration data, automatically calibrating the playing of the different digital music based on the user profile that is associated with the user account data, wherein the method is performed by one or more computing devices.

15. The computer-readable storage media of claim 14, wherein the instructions, when executed by the at least one processor, cause:
   displaying, in a user interface that is coupled to the one or more computing devices, a graphical representation of playback attributes that are used to conduct the computer-assisted hearing evaluation;
   during the playing, updating the user interface to include a graphical representation of the timestamp data in relation to the playback attributes.

16. The computer-readable storage media of claim 15, wherein the instructions, when executed by the at least one processor, cause displaying the user interface in a web-based software application that is coupled to the one or more computing devices.

17. The computer-readable storage media of claim 15, wherein the instructions, when executed by the at least one processor, cause displaying the user interface in a mobile device application that is coupled to the one or more computing devices.

18. The computer-readable storage media of claim 15, wherein updating the user interface includes displaying a set of concentric circles each representing a different volume level, displaying a set of radii emanating inwardly from a perimeter circle of the set of concentric circles, wherein a length of a particular radius is determined based on the timestamp data.

19. The computer-readable storage media of claim 18, wherein updating the user interface includes graphically dividing the set of concentric circles to represent the left/right data.

20. The computer-readable storage media claim 15, wherein the instructions, when executed by the at least one processor, cause recording timestamp data associated with particular user inputs received in response to the playing of the at least two segments of the digital music, and updating the user interface to include nodes that correspond to the at least two segments and radii emanating from the nodes, wherein the radii represent the timestamp data associated with the particular user input received in response to playing the corresponding segment of the digital music.

* * * * *